US010573569B2

(12) United States Patent
Furukawa et al.

(10) Patent No.: US 10,573,569 B2
(45) Date of Patent: Feb. 25, 2020

(54) THERMAL PROCESSING APPARATUS AND THERMAL PROCESSING METHOD THROUGH LIGHT IRRADIATION

(71) Applicant: SCREEN Holdings Co., Ltd., Kyoto (JP)

(72) Inventors: Masashi Furukawa, Kyoto (JP); Hikaru Kawarazaki, Kyoto (JP); Kazuhiko Fuse, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 16/280,816

(22) Filed: Feb. 20, 2019

(65) Prior Publication Data
US 2019/0181058 A1 Jun. 13, 2019

Related U.S. Application Data

(62) Division of application No. 15/374,164, filed on Dec. 9, 2016, now abandoned.

(30) Foreign Application Priority Data

Dec. 22, 2015 (JP) .................................. 2015-249367

(51) Int. Cl.
*H01L 21/66* (2006.01)
*H01L 21/67* (2006.01)
(Continued)

(52) U.S. Cl.
CPC ............ *H01L 22/20* (2013.01); *G01J 5/0007* (2013.01); *H01L 21/324* (2013.01);
(Continued)

(58) Field of Classification Search
CPC ... C23C 16/4584; C23C 16/46; C23C 16/463; C23C 16/481; C23C 16/488;
(Continued)

(56) References Cited

U.S. PATENT DOCUMENTS

| 5,710,407 A | 1/1998 | Moore et al. ................. 219/405 |
| 6,074,696 A * | 6/2000 | Sato .................... C23C 16/4584 216/59 |

(Continued)

FOREIGN PATENT DOCUMENTS

| JP | S56-122923 A | 9/1981 |
| JP | 2001-304971 A | 10/2001 |

(Continued)

OTHER PUBLICATIONS

Notice of Reasons for Refusal dated Mar. 26, 2019 in counterpart Japanese Patent Application No. 2015-249367 with English translation obtained from One Portal Dossier.

(Continued)

*Primary Examiner* — Edward Chin
(74) *Attorney, Agent, or Firm* — Ostrolenk Faber LLP

(57) ABSTRACT

A substrate in a chamber is preheated through light irradiation by a halogen lamp and then heated through irradiation with flash light from a flash lamp. Ammonia is supplied to the chamber from an ammonia supply mechanism to form ammonia atmosphere. The temperature of the substrate at heating processing is measured by a radiation thermometer. When the measurement wavelength band of the radiation thermometer overlaps with the absorption wavelength band of ammonia, the set emissivity of the radiation thermometer is changed and set to be lower than the actual emissivity of the substrate. When radiation light emitted from the substrate is absorbed by the ammonia atmosphere, the radiation thermometer can accurately output the temperature of the substrate as a measured value by reducing the set emissivity of the radiation thermometer.

5 Claims, 10 Drawing Sheets

(51) Int. Cl.
*G01J 5/00* (2006.01)
*H01L 21/324* (2006.01)
*H05B 1/02* (2006.01)

(52) U.S. Cl.
CPC .. *H01L 21/67115* (2013.01); *H01L 21/67248* (2013.01); *H01L 22/12* (2013.01); *H05B 1/0233* (2013.01); *H01L 22/10* (2013.01)

(58) Field of Classification Search
CPC ............. G01J 5/0003; H01L 21/67109; H01L 21/67115; H01L 21/67248; H01L 118/724; H01L 216/59; H01L 219/497; H01L 219/502; H01L 374/121; H01L 392/416; H01L 432/25
See application file for complete search history.

(56) References Cited

U.S. PATENT DOCUMENTS

| | | | |
|---|---|---|---|
| 6,479,801 B1* | 11/2002 | Shigeoka | G01J 5/0003 219/502 |
| 8,883,585 B1 | 11/2014 | Fumitake | |
| 9,123,743 B2* | 9/2015 | Lin | H01L 29/66545 |
| 9,166,010 B2 | 10/2015 | Kelly | |
| 9,324,820 B1 | 4/2016 | Kelly | |
| 9,425,259 B1 | 8/2016 | Suk | |
| 9,634,104 B2 | 4/2017 | Chao | |
| 9,634,143 B1 | 4/2017 | Wahl | |
| 9,660,075 B2 | 5/2017 | Koh | |
| 2001/0034004 A1* | 10/2001 | Kitamura | C23C 16/481 432/250 |
| 2003/0206574 A1 | 11/2003 | Yun | 374/135 |
| 2005/0112817 A1* | 5/2005 | Cheng | H01L 21/823807 438/219 |
| 2006/0275975 A1* | 12/2006 | Yeh | H01L 21/823842 438/216 |
| 2010/0111512 A1 | 5/2010 | Kumagai et al. | 329/416 |
| 2014/0061814 A1* | 3/2014 | Kim | H01L 21/823857 257/369 |
| 2014/0252557 A1 | 9/2014 | Flachowsky | |
| 2014/0273360 A1 | 9/2014 | Cheng | |
| 2015/0325488 A1* | 11/2015 | Yamada | H01L 21/67248 438/5 |
| 2015/0380489 A1 | 12/2015 | Chan | |
| 2018/0247956 A1* | 8/2018 | Stamper | H01L 21/823468 |

FOREIGN PATENT DOCUMENTS

| | | |
|---|---|---|
| JP | 2005-207997 A | 8/2005 |
| JP | 2007-183207 A | 7/2007 |
| JP | 2010-225613 | 10/2010 |

OTHER PUBLICATIONS

Taiwan Office Action for Taiwan Application No. 105136998 dated Nov. 17, 2017 with English partial translation of the Office Action based on the Japanese translation (attached).
Office Action dated Aug. 28, 2018 in counterpart Taiwan Patent Application No. 105136998 with Japanese translation and English partial translation based on the Japanese translation.
Office Action and Search Report dated Dec. 21, 2018 in corresponding Taiwanese Application No. 105136998 and English partial translation based on the Japanese translation (attached).

* cited by examiner

F I G. 4
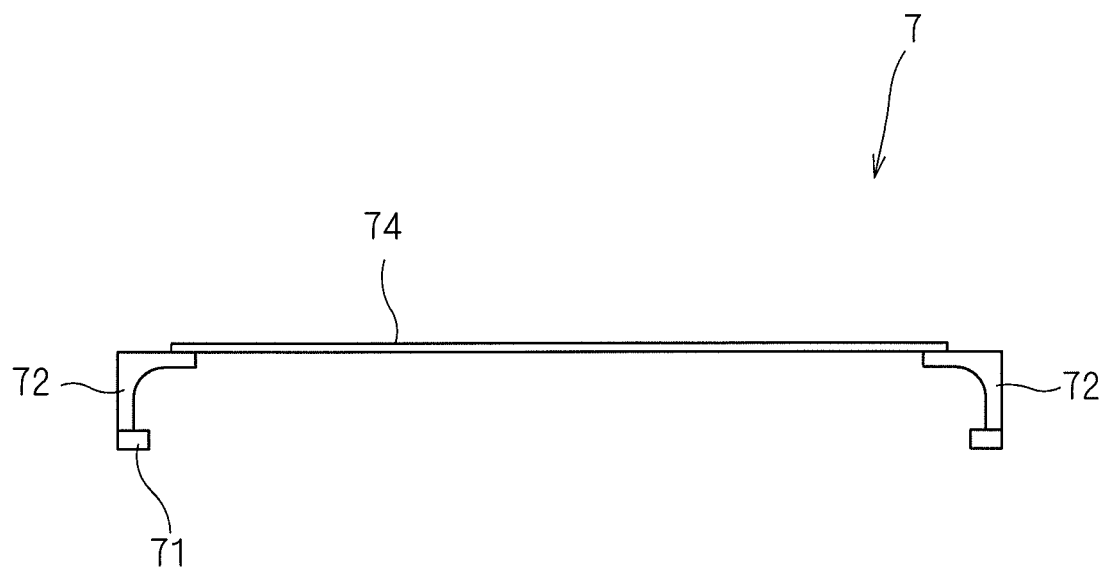

F I G . 10
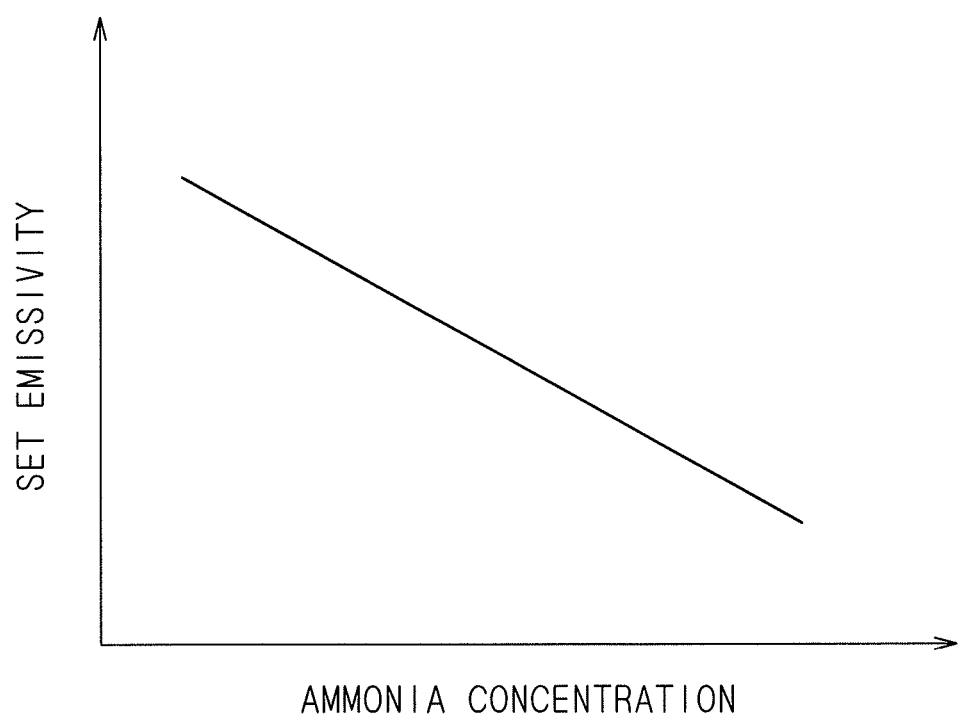

THERMAL PROCESSING APPARATUS AND THERMAL PROCESSING METHOD THROUGH LIGHT IRRADIATION

CROSS-REFERENCE TO RELATED APPLICATIONS

The present application is a divisional of prior U.S. patent application Ser. No. 15/374,164, filed Dec. 9, 2016, by Masashi FURUKAWA, Hikaru KAWARAZAKI and Kazuhiko FUSE, entitled "THERMAL PROCESSING APPARATUS AND THERMAL PROCESSING METHOD THROUGH LIGHT IRRADIATION," which claims priority to Japanese Patent Application No. JP2015-249367, filed Dec. 22, 2015. The entire contents of each of these patent applications are incorporated herein by reference.

BACKGROUND OF THE INVENTION

Field of the Invention

The present invention relates to a thermal processing apparatus and a thermal processing method that heat a thin-plate fine electronic substrate (hereinafter simply referred to as a "substrate") such as a semiconductor wafer by irradiating the substrate with light.

Description of the Background Art

In a process of manufacturing a semiconductor device, flash lamp annealing (FLA) that heats a semiconductor wafer in an extremely short time has attracted attention. The flash lamp annealing is a thermal processing technology of rising temperature only at the surface of a semiconductor wafer in an extremely short time (several milliseconds or less) by irradiating the surface of the semiconductor wafer with flash light using a xenon flash lamp (hereinafter, a simple notation of "flash lamp" means the xenon flash lamp).

The xenon flash lamp has an emission spectral distribution ranging from ultraviolet to near-infrared, and has a wavelength shorter than that of the conventional halogen lamp, which is substantially the same as the fundamental absorption band of a silicon semiconductor wafer. Thus, when the semiconductor wafer is irradiated with flash light from the xenon flash lamp, less light is transmitted and thus the temperature of the semiconductor wafer can be rapidly risen. It has been found that the flash light irradiation in an extremely short time less than several milliseconds can selectively rise temperature only at the vicinity of the surface of the semiconductor wafer.

Such flash lamp annealing is used in processing that needs heating in an extremely short time, such as activation of impurities implanted in a semiconductor wafer as a typical example. Temperature at the surface of a semiconductor wafer in which impurities are implanted by an ion implantation technique can be risen to an activation temperature in an extremely short time by irradiating the surface of the semiconductor wafer with flash light from a flash lamp. Accordingly, only the impurity activation can be executed without diffusing the impurities deeply.

In any thermal processing including the flash lamp annealing, it is important to appropriately manage the temperature of a semiconductor wafer. Typically, temperature measurement is performed by a non-contact radiation thermometer in the thermal processing of a semiconductor wafer. For example, Japanese Patent Laid-open No. 2010-225613 discloses that the temperature of a semiconductor wafer is measured by a radiation thermometer at preheating by a halogen lamp before flash light irradiation.

The emissivity of a measured object is an important factor at temperature measurement by a radiation thermometer. The emissivity of the surface of a semiconductor wafer largely changes depending on a pattern and the type of a film formed thereon, but the emissivity of the back surface thereof is substantially constant and has a uniform in-plane distribution. Thus, as disclosed in Japanese Patent Laid-open No. 2010-225613, it is preferable to perform temperature measurement through reception of radiation light emitted from the back surface of the semiconductor wafer. In this case, the previously known emissivity of the back surface of the semiconductor wafer only needs to be set to the radiation thermometer.

In some studies, the flash lamp annealing is applied to thermal processing of a semiconductor wafer in which a high-dielectric-constant film (high-k film) made of a material (high-dielectric-constant material) having a dielectric constant higher than that of silicon dioxide ($SiO_2$) is formed as a gate insulating film of a field effect transistor (FET). The high-dielectric-constant film has been developed as a new stack structure along with a metal gate electrode, which is a gate electrode made of metal, so as to solve adverse increase in leakage current as a thinner gate insulating film is used. It has been tested to perform, when the flash lamp annealing is employed in thermal processing of such a high-dielectric-constant gate insulating film, nitridation processing of the high-dielectric-constant gate insulating film in ammonia atmosphere.

However, when thermal processing of a semiconductor wafer is performed in ammonia atmosphere, temperature measurement by a radiation thermometer is encumbered by ammonia. Ammonia absorbs infrared used by the radiation thermometer in measurement, and thus the intensity of infrared received by the radiation thermometer decreases. As a result, a measured value output by the radiation thermometer is lower than the actual wafer temperature. Typically, in the flash lamp annealing, the semiconductor wafer is preheated by a halogen lamp before flash light irradiation, and closed-loop control is performed on the output of the halogen lamp based on a result of the measurement by the radiation thermometer. Thus, when the measurement result is lower than the actual wafer temperature, the output of the lamp becomes excessive and the semiconductor wafer is heated to a temperature higher than a target temperature.

SUMMARY OF THE INVENTION

The present invention is intended to provide a thermal processing apparatus configured to heat a substrate by irradiating the substrate with light.

According to an aspect of the present invention, thermal processing apparatus includes: a chamber housing a substrate, a light irradiation unit configured to irradiate the substrate housed in the chamber with light, a gas supply unit configured to supply predetermined processing gas to the chamber to form atmosphere of the processing gas around the substrate, a radiation thermometer configured to measure the temperature of the substrate through reception of infrared light emitted from the substrate, a control unit configured to control output of the light irradiation unit based on a result of the measurement by the radiation thermometer so that the substrate reaches a target temperature, and an emissivity determination unit configured to change a set emissivity of the radiation thermometer to be lower than the actual emissivity of the substrate when a measurement wavelength band of the radiation thermometer overlaps with an absorption wavelength band of the processing gas.

This allows accurate measurement of the temperature of the substrate when, in the atmosphere of the processing gas that absorbs infrared light, the intensity of radiation light from the substrate is reduced through absorption by the processing gas.

Preferably, the thermal processing apparatus may further include a storage unit configured to store a table representing a correlation relation between a concentration of the processing gas and the set emissivity, and the emissivity determination unit may determine the set emissivity corresponding to the concentration of the processing gas in atmosphere in the chamber based on the table.

This allows determination of a set emissivity appropriate for the concentration of the processing gas.

Preferably, the storage unit may store the table individually for each of a plurality of target temperatures.

This allows determination of a set emissivity appropriate for a target temperature.

The present invention is also intended to provide a thermal processing method of heating a substrate by irradiating the substrate with light.

According to an aspect of the present invention, a thermal processing method includes the steps of: (a) supplying predetermined processing gas to a chamber housing a substrate to form atmosphere of the processing gas around the substrate, (b) irradiating the substrate in the atmosphere of the processing gas with light from a light irradiation unit, (c) measuring the temperature of the substrate through a radiation thermometer receiving infrared light emitted from the substrate, and (d) controlling output of the light irradiation unit based on a result of the measurement in the step (c) so that the substrate reaches a target temperature. A set emissivity of the radiation thermometer is changed to be lower than the actual emissivity of the substrate when a measurement wavelength band of the radiation thermometer overlaps with an absorption wavelength band of the processing gas.

This allows accurate measurement of the temperature of the substrate when, in the atmosphere of the processing gas that absorbs infrared light, the intensity of radiation light from the substrate is reduced through absorption by the processing gas.

Preferably, the set emissivity may be determined from the concentration of the processing gas in atmosphere in the chamber based on a table representing a correlation relation between a concentration of said processing gas and the set emissivity.

This allows determination of a set emissivity appropriate for the concentration of the processing gas.

Preferably, the table may be produced individually for each a plurality of target temperatures.

This allows determination of a set emissivity appropriate for a target temperature.

Therefore, it is an object of the present invention to accurately measure the temperature of a substrate in atmosphere of processing gas that absorbs infrared light.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a side view of the holding unit;

FIG. 10 is a diagram illustrating an exemplary correlation table representing a correlation relation between the concentration of ammonia and a set emissivity.

DESCRIPTION OF THE PREFERRED EMBODIMENTS

Preferred embodiments of the present invention will be described in detail below with reference to the accompanying drawings.

Figure 1:
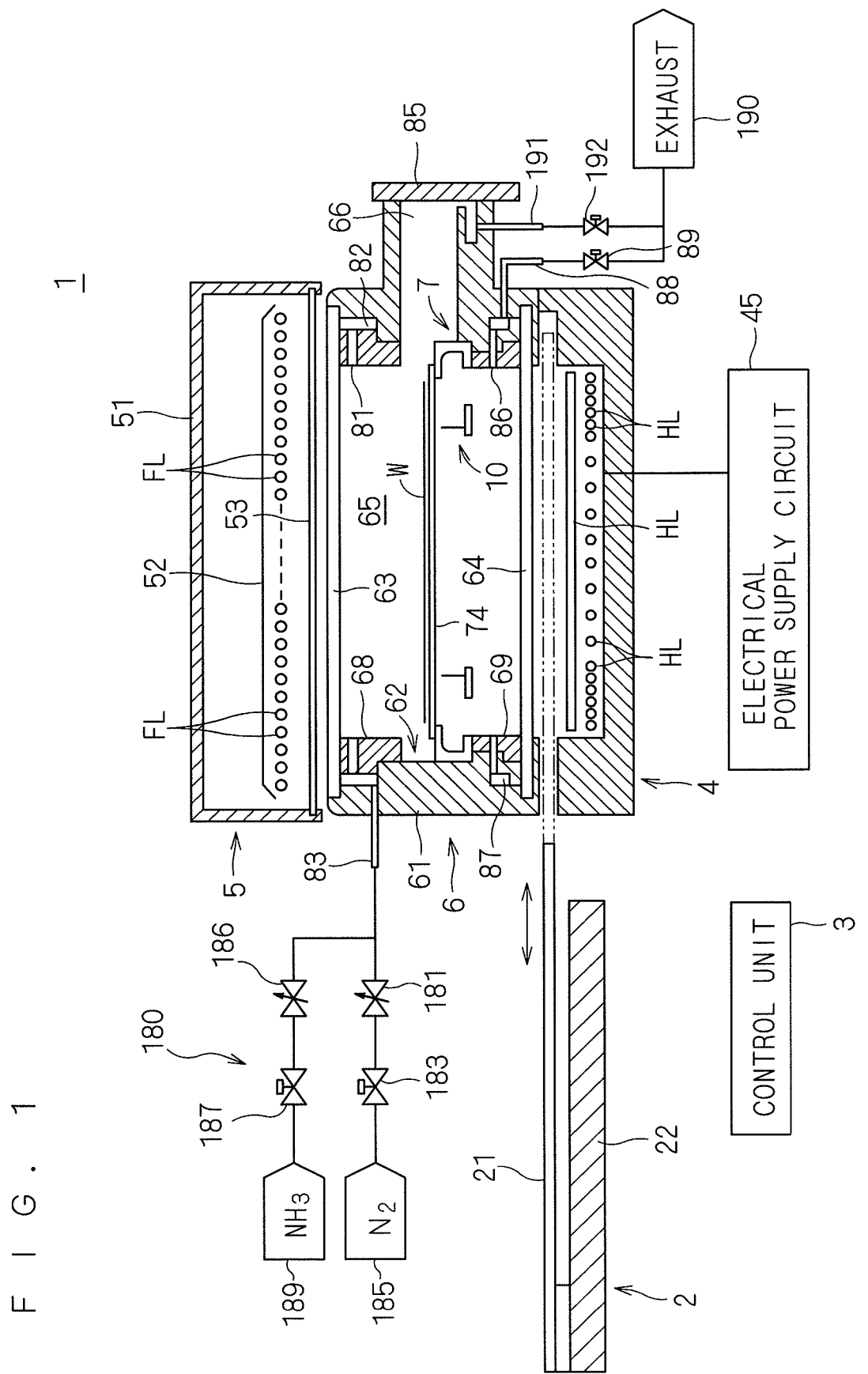
FIG. 1 is a vertical sectional view illustrating the configuration of a thermal processing apparatus according to the present invention.

FIG. 1 is a vertical sectional view illustrating the configuration of a thermal processing apparatus 1 according to the present invention. The thermal processing apparatus 1 according to the present preferred embodiment is a flash lamp annealer configured to facilitate post deposition annealing (PDA) of a high-dielectric-constant gate insulating film (high-k film) by irradiating, with flash light in ammonia atmosphere, a semiconductor substrate W on which the high-dielectric-constant gate insulating film is deposited. In FIG. 1 and the following drawings, the dimension of each component and the number thereof are exaggerated or simplified as necessary to facilitate understanding.

The thermal processing apparatus 1 includes a chamber 6 configured to house the substrate W, a flash heating unit 5 including a plurality of built-in flash lamps FL, a halogen heating unit 4 including a plurality of built-in halogen lamps HL, and a shutter mechanism 2. The flash heating unit 5 is provided above the chamber 6, and the halogen heating unit 4 is provided below the chamber 6. The thermal processing apparatus 1 also includes, inside the chamber 6, a holding unit 7 configured to hold the substrate W in a horizontal posture, and a transfer mechanism 10 configured to transfer the substrate W between the holding unit 7 and the outside of the apparatus. The thermal processing apparatus 1 also includes an ammonia supply mechanism 180 configured to supply ammonia ($NH_3$) into the chamber 6. The thermal processing apparatus 1 also includes a control unit 3 configured to execute thermal processing of the substrate W by controls operation mechanisms provided to the shutter mechanism 2, the ammonia supply mechanism 180, the halogen heating unit 4, the flash heating unit 5, and the chamber 6.

The chamber 6 is provided with a chamber window made of quartz mounted above and below a tubular chamber side part 61. The chamber side part 61 substantially has a tubular shape with openings at its upper and lower sides. The upper opening is closed by mounting an upper chamber window 63 thereon, and the lower opening is closed by mounting a lower chamber window 64 thereon. The upper chamber window 63 constituting the ceiling of the chamber 6 is a circular disk shape member made of quartz, and functions as a quartz window that transmits flash light emitted from the flash heating unit 5 into the chamber 6. The lower chamber window 64 constituting the floor of the chamber 6 is a circular disk shape member made of quartz, and functions as a quartz window that transmits light from the halogen heating unit 4 into the chamber 6.

A reflection ring 68 is mounted at an upper part of an inner wall surface of the chamber side part 61, and a reflection ring 69 is mounted at a lower part thereof. The reflection rings 68 and 69 are each formed in a circular ring. The upper reflection ring 68 is mounted by being inset from above the chamber side part 61. The lower reflection ring 69 is mounted by being inset from below the chamber side part 61 and fastened by a screw (not illustrated). In other words, the reflection rings 68 and 69 are detachably mounted on the chamber side part 61. A thermal processing space 65 is defined to be an inner space of the chamber 6, which is a space enclosed by the upper chamber window 63, the lower chamber window 64, the chamber side part 61, and the reflection rings 68 and 69.

When the reflection rings 68 and 69 are mounted on the chamber side part 61, a recess 62 is formed on an inner wall surface of the chamber 6. In other words, the recess 62 is formed, the recess 62 being enclosed by a central part of the inner wall surface of the chamber side part 61, where the reflection rings 68 and 69 are not mounted, a lower end surface of the reflection ring 68, and an upper end surface of the reflection ring 69. The recess 62 is formed in a circular ring on the inner wall surface of the chamber 6 along the horizontal direction, surrounding the holding unit 7 that holds the substrate W.

The chamber side part 61 and the reflection rings 68 and 69 are made of a metal material (for example, stainless steel) that is excellent in strength and thermal resistance. The inner peripheral surfaces of the reflection rings 68 and 69 are mirrored by electrolytic nickel plating.

The chamber side part 61 is provided with a transfer opening (furnace entrance) 66 through which the substrate W is transferred into and from the chamber 6. The transfer opening 66 can be opened and closed through a gate valve 85. The transfer opening 66 is communicated with the outer peripheral surface of the recess 62. With this configuration, when the transfer opening 66 is opened by the gate valve 85, the substrate W can be transferred to and from the thermal processing space 65 through the transfer opening 66 and the recess 62. When the transfer opening 66 is closed by the gate valve 85, the thermal processing space 65 in the chamber 6 is an enclosed space.

A gas supply hole 81 for supplying predetermined gas to the thermal processing space 65 is provided at an upper part of the inner wall of the chamber 6. The gas supply hole 81 is provided higher than the recess 62, and may be provided to the reflection ring 68. The gas supply hole 81 is communicated with a gas supply pipe 83 through a buffer space 82 formed in a circular ring on the inner sidewall of the chamber 6. The gas supply pipe 83 is connected to the ammonia supply mechanism 180. Specifically, the gas supply pipe 83 is bifurcated into two paths, one of the paths being connected to a nitrogen gas supply source 185, and the other being connected to an ammonia supply source 189. A valve 183 and a flow-rate adjustment valve 181 are inserted on the path connected to the nitrogen gas supply source 185 among the bifurcated paths of the gas supply pipe 83, and a valve 187 and a flow-rate adjustment valve 186 are inserted on the path connected to the ammonia supply source 189.

When the valve 183 is opened, nitrogen gas ($N_2$) supplied from the nitrogen gas supply source 185 to the buffer space 82 through the gas supply pipe 83. The flow rate of the nitrogen gas flowing through the gas supply pipe 83 is adjusted by the flow-rate adjustment valve 181. When the valve 187 is opened, ammonia gas ($NH_3$) is supplied from the ammonia supply source 189 to the buffer space 82 through the gas supply pipe 83. The flow rate of the ammonia flowing through the gas supply pipe 83 is adjusted by the flow-rate adjustment valve 186. Gas flowing into the buffer space 82 spreads inside the buffer space 82 having a fluid resistance smaller than that of the gas supply hole 81 and is supplied into the thermal processing space 65 through the gas supply hole 81.

The nitrogen gas supply source 185, the valve 183, the flow-rate adjustment valve 181, the ammonia supply source 189, the valve 187, the flow-rate adjustment valve 186, the gas supply pipe 83, the buffer space 82, and the gas supply hole 81 are included in the ammonia supply mechanism 180. When both of the valve 183 and the valve 187 are opened, mixed gas of ammonia and nitrogen gas can be supplied to the chamber 6 as processing gas. The concentration of ammonia included in the mixed gas supplied to the chamber 6 by the ammonia supply mechanism 180 is 10 vol. % approximately or less, and is 3.5 vol. % in the present preferred embodiment.

A gas exhaust hole 86 for exhausting gas in the thermal processing space 65 is provided at a lower part of the inner wall of the chamber 6. The gas exhaust hole 86 is provided lower than the recess 62, and may be provided to the reflection ring 69. The gas exhaust hole 86 is communicated with a gas exhaust pipe 88 through a buffer space 87 formed in a circular ring on the inner sidewall of the chamber 6. The gas exhaust pipe 88 is connected with an exhaust unit 190. A valve 89 is inserted on the path of the gas exhaust pipe 88. When the valve 89 is opened, gas in the thermal processing space 65 is exhausted to the gas exhaust pipe 88 through the gas exhaust hole 86 and the buffer space 87. A plurality of the gas supply holes 81 and the gas exhaust holes 86 may be provided along the circumferential direction of the chamber 6, and may be shaped in slits.

Another gas exhaust pipe 191 for exhausting gas in the thermal processing space 65 is connected with a leading end of the transfer opening 66. The gas exhaust pipe 191 is connected with the exhaust unit 190 through a valve 192. When the valve 192 is opened, gas in the chamber 6 is exhausted through the transfer opening 66.

The exhaust unit 190 may be a vacuum pump or an exhaust utility of a factory in which the thermal processing apparatus 1 is installed. When the vacuum pump is employed as the exhaust unit 190, the inside of the chamber 6 can be depressurized to vacuum atmosphere by exhausting atmosphere in the thermal processing space 65, which is an enclosed space, without gas supply from the ammonia supply mechanism 180. When the vacuum pump is not used as the exhaust unit 190, the inside of the chamber 6 can be depressurized to a pressure lower than atmospheric pressure through exhaust without gas supply from the ammonia supply mechanism 180.

Ammonia atmosphere can be formed in the thermal processing space 65 in the chamber 6 by the ammonia supply mechanism 180 and the exhaust unit 190. Specifically, ammonia atmosphere at a predetermined ammonia concentration (3.5 vol. % approximately in the present preferred embodiment) can be formed in the thermal processing space 65 by supplying mixed gas of ammonia and nitrogen gas as diluent gas from the ammonia supply mechanism 180 to the thermal processing space 65 while exhausting gas from the thermal processing space 65 by the exhaust unit 190.

Figure 2:
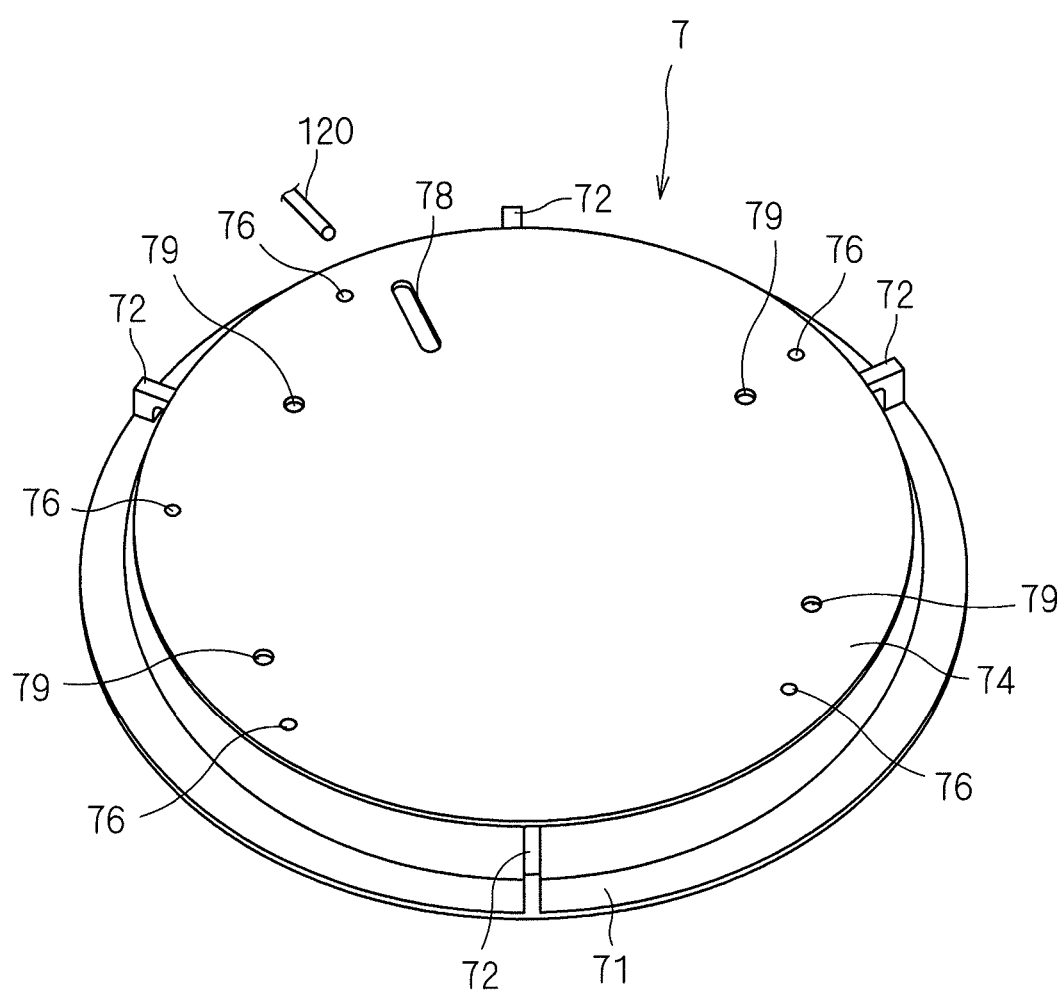
FIG. 2 is a perspective view illustrating the entire appearance of a holding unit.
Figure 3:
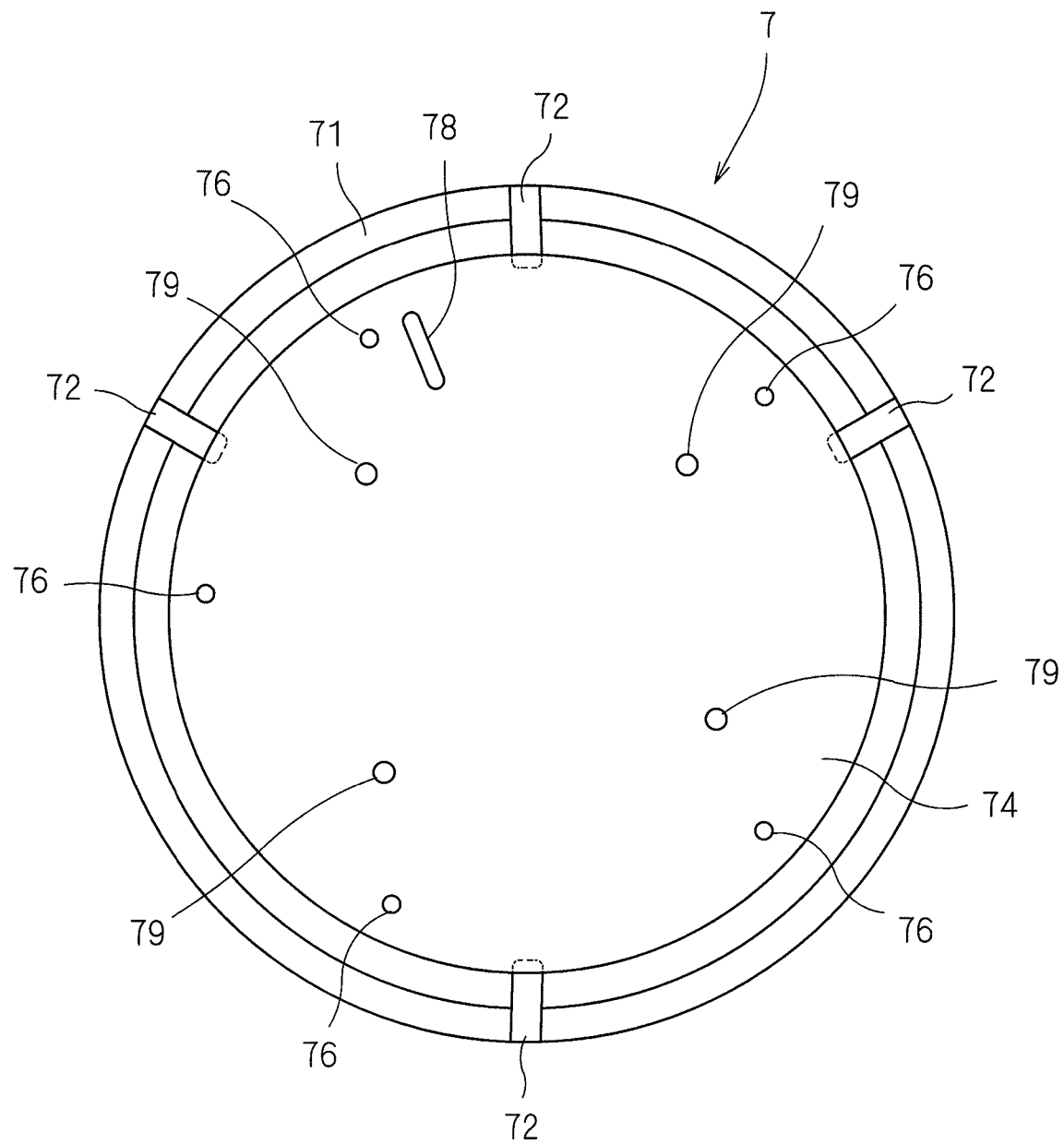
FIG. 3 is a plan view of the holding unit viewed from top.

FIG. 2 is a perspective view illustrating the entire appearance of the holding unit 7. FIG. 3 is a plan view of the holding unit 7 viewed from top, and FIG. 4 is a side view of the holding unit 7. The holding unit 7 includes a base ring 71, a coupling member 72, and a susceptor 74. The base ring 71, the coupling member 72, and the susceptor 74 are made of quartz. In other words, the entire holding unit 7 is made of quartz.

The base ring 71 is a quartz member having a circular ring shape. The base ring 71 is supported on the wall surface of the chamber 6 when placed on the bottom surface of the recess 62 (refer to FIG. 1). A plurality (in the present preferred embodiment, four) of the coupling members 72 are erected on the upper surface of the circular-ring base ring 71 along the circumferential direction thereof. The coupling member 72 is made of quartz and adhered to the base ring 71 by welding. The shape of the base ring 71 may be an arc, which is a circular ring with part thereof being lacked.

The flat plate susceptor 74 is supported by the four coupling members 72 provided to the base ring 71. The susceptor 74 is a flat plate member made of quartz and substantially having a circular shape. The susceptor 74 has a diameter larger than the diameter of the substrate W. In other words, the susceptor 74 has a plane size larger than that of the substrate W. A plurality (in the present preferred embodiment, five) of guide pins 76 are erected on the upper surface of the susceptor 74. The five guide pins 76 are provided on the periphery of a concentric circle of the outer peripheral circle of the susceptor 74. The circle on which the five guide pins 76 are arranged has a diameter slightly larger than the diameter of the substrate W. Each guide pin 76 is also made of quartz. The guide pin 76 may be fabricated from quartz ingot integrally with the susceptor 74, or may be fabricated separately from the susceptor 74 and attached to the susceptor 74 by, for example, welding.

The four coupling members 72 erected on the base ring 71 are adhered to the lower surface of a peripheral part of the susceptor 74 by welding. In other words, the susceptor 74 and the base ring 71 are fixedly coupled with each other through the coupling members 72, and the holding unit 7 is an integrally formed quartz member. The base ring 71 of the holding unit 7 is supported on the wall surface of the chamber 6, and the holding unit 7 is mounted on the chamber 6. When the holding unit 7 is mounted on the chamber 6, the susceptor 74 substantially having a circular disk shape is in a horizontal posture (in which the normal thereof is aligned with the vertical direction). The substrate W transferred into the chamber 6 is placed and held in a horizontal posture on the susceptor 74 of the holding unit 7 mounted on the chamber 6. The substrate W is placed inside a circle formed by the five guide pins 76 to prevent any positional shift in the horizontal direction. The number of the guide pins 76 is not limited to five, but may be any number enough to prevent the positional shift of the substrate W.

As illustrated in FIGS. 2 and 3, a vertically penetrating opening 78 is formed in the susceptor 74. The opening 78 is provided to allow a radiation thermometer 120 to receive radiation light (infrared light) emitted from a lower surface of the substrate W held by the susceptor 74. The radiation thermometer 120 measures the temperature of the lower surface of the substrate W based on the intensity of the radiation light. The radiation thermometer 120 has a measurement wavelength band of wavelength 6.5 μm to 14 μm in an infrared region. Infrared light in this wavelength band does not transmit through the upper chamber window 63 and the lower chamber window 64, which are made of quartz. Thus, among light emitted from the flash lamps FL and the halogen lamps HL, infrared light in the measurement wavelength band of the radiation thermometer 120 is blocked by the upper chamber window 63 and the lower chamber window 64. This prevents the light emitted from the flash lamps FL and the halogen lamps HL from acting as disturbance light in temperature measurement by the radiation thermometer 120. In addition, four through-holes 79 through which a lift pin 12 of the transfer mechanism 10 to be described later is penetrated for transferring of the substrate W are drilled in the susceptor 74. Measurement of the temperature of the substrate W by the radiation thermometer 120 will be described in detail later.

Figure 5:
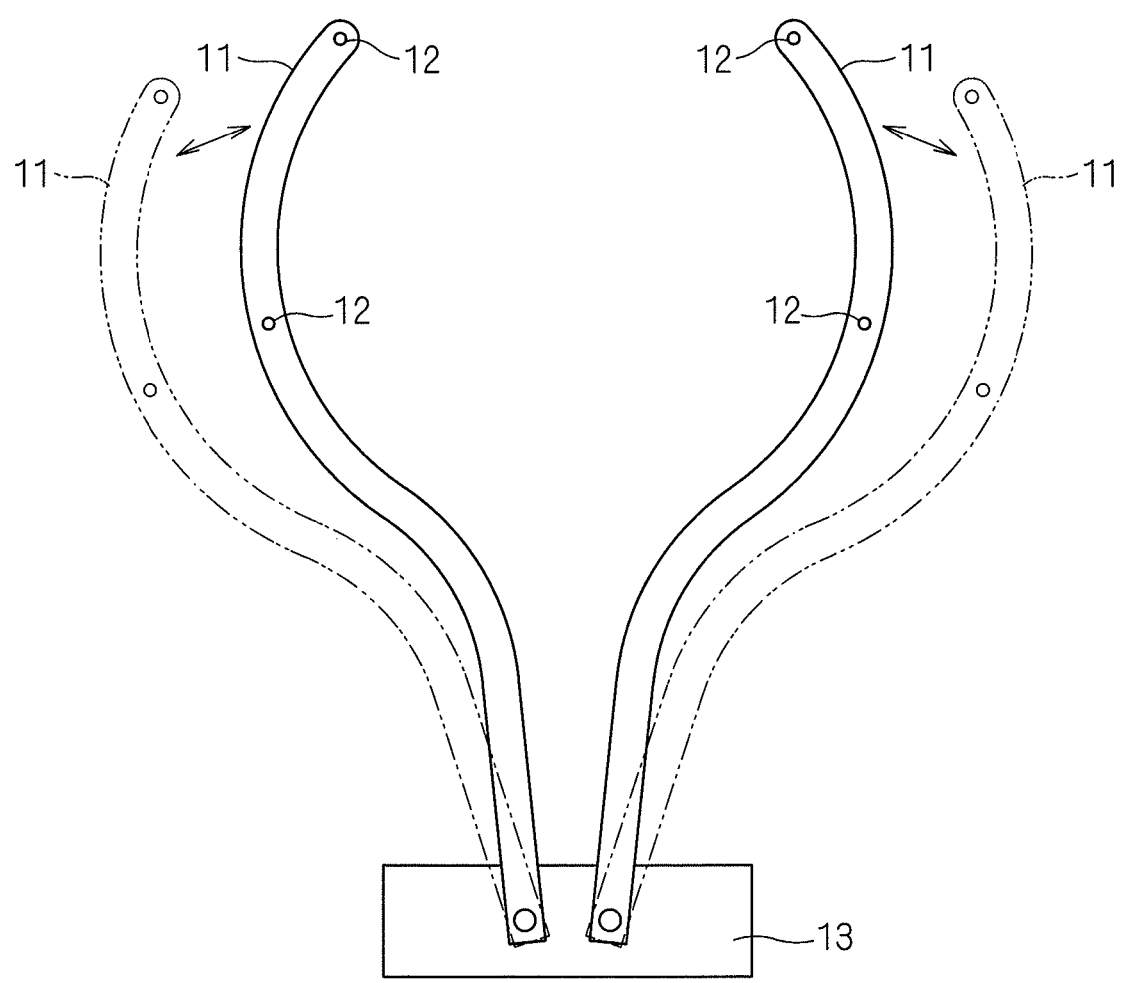
FIG. 5 is a plan view of a transfer mechanism.
Figure 6:
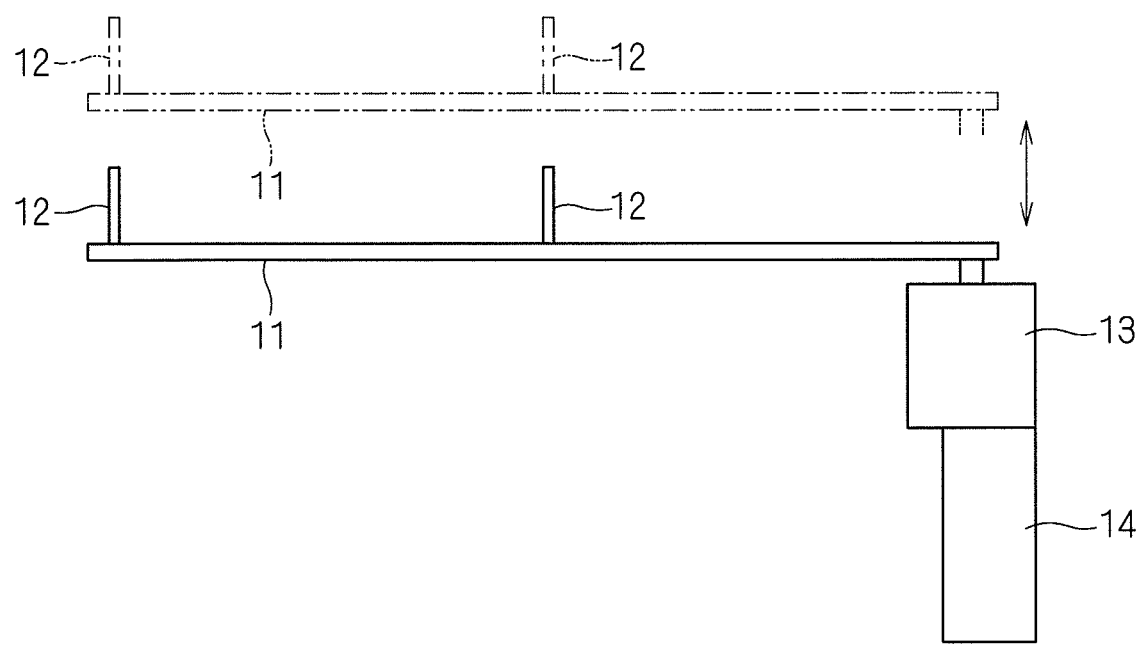
FIG. 6 is a side view of the transfer mechanism.

FIG. 5 is a plan view of the transfer mechanism 10. FIG. 6 is a side view of the transfer mechanism 10. The transfer mechanism 10 includes two transfer arms 11. The transfer arms 11 each have an arc shape along the substantially circular ring shape of the recess 62. The two lift pins 12 are erected on each transfer arm 11. Each transfer arm 11 can be rotated by a horizontal movement mechanism 13. The horizontal movement mechanism 13 allows the pair of transfer arms 11 to horizontally move between a transfer operation position (position illustrated by a solid line in FIG. 5) at which the horizontal movement mechanism 13 performs transfer of the substrate W onto the holding unit 7, and a retracted position (position illustrated by a dashed and double-dotted line in FIG. 5) at which the pair of transfer arms 11 does not overlap with the substrate W held by the holding unit 7 in plan view. The horizontal movement mechanism 13 may be configured to rotate individually the transfer arms 11 through individual motors, or may be configured to rotate the pair of transfer arms 11 in a cooperative manner through one motor using a link mechanism.

The pair of transfer arms 11 are moved up and down together with the horizontal movement mechanism 13 by an elevation mechanism 14. When the elevation mechanism 14 moves up the pair of transfer arms 11 at the transfer operation position, a total of four of the lift pins 12 passes through the through-holes 79 (refer to FIGS. 2 and 3) drilled in the susceptor 74, so that the upper ends of the lift pins 12 stick out of the upper surface of the susceptor 74. When the elevation mechanism 14 moves down the pair of transfer arms 11 at the transfer operation position to remove the lift pins 12 from the through-holes 79, and the horizontal movement mechanism 13 moves the pair of transfer arms 11 to open, the transfer arms 11 are moved to the retracted position. The retracted position of the pair of transfer arms 11 is located directly above the base ring 71 of the holding unit 7. Since the base ring 71 is placed on the bottom surface of the recess 62, the retracted position of the transfer arms 11 is located inside the recess 62. An exhaust mechanism (not illustrated) is provided near positions at which the driving units (the horizontal movement mechanism 13 and the elevation mechanism 14) of the transfer mechanism 10 are provided, so as to exhaust atmosphere around the driving units of the transfer mechanism 10 out of the chamber 6.

With reference to FIG. 1 again, the flash heating unit 5 provided above the chamber 6 includes, inside a housing 51, a light source including a plurality (in the present preferred embodiment, thirty) of the xenon flash lamps FL, and a reflector 52 provided to cover above the light source. A lamp light emission window 53 is mounted on a bottom part of the housing 51 of the flash heating unit 5. The lamp light emission window 53 constituting the floor of the flash heating unit 5 is a plate quartz window made of quartz. Since the flash heating unit 5 is installed above the chamber 6, the lamp light emission window 53 and the upper chamber window 63 face to each other. The flash lamps FL irradiate the thermal processing space 65 with flash light from above the chamber 6 through the lamp light emission window 53 and the upper chamber window 63 to perform flash heating of the substrate W.

The plurality of flash lamps FL are each a bar lamp having a long cylinder shape and are arrayed in a plane such that the longitudinal directions of the flash lamps FL are parallel to each other along a main surface of the substrate W held by the holding unit 7 (along the horizontal direction). Thus, a plane defined by the arrangement of the flash lamps FL is also a horizontal plane.

The xenon flash lamps FL each include a bar glass tube (discharge tube) in which xenon gas is encapsulated and at both end parts of which an anode and a cathode connected to a capacitor are arranged, and a trigger electrode attached to an outer circumferential surface of the glass tube. Since xenon gas is electrically an insulator, electricity does not flow in the glass tube in a normal state even when electric charge is accumulated on the capacitor. However, when insulation breakdown is achieved by applying high voltage to the trigger electrode, electricity stored on the capacitor instantaneously flows in the glass tube, and light is released through excitation of xenon atoms or molecules. In such a xenon flash lamp FL, electrostatic energy previously stored on the capacitor is converted into an extremely short light pulse of 0.1 millisecond to 100 milliseconds. Thus, the xenon flash lamp FL can emit extremely strong light as compared to a continuously lighting source such as the halogen lamps HL. In other words, the flash lamps FL is a pulsed emission lamp configured to instantaneously emit light in an extremely short time less than one second. The light emission time of the flash lamps FL can be adjusted through a coil constant of a lamp power source that supplies electrical power to the flash lamps FL.

The reflector 52 is provided above the plurality of flash lamps FL, covering the entire flash lamps FL. A basic function of the reflector 52 is to reflect, toward the thermal processing space 65, flash light emitted from the plurality of flash lamps FL. The reflector 52 is formed as an aluminum alloy plate, and has a surface (facing to the flash lamps FL) provided with roughing fabrication by blast processing.

Figure 7:
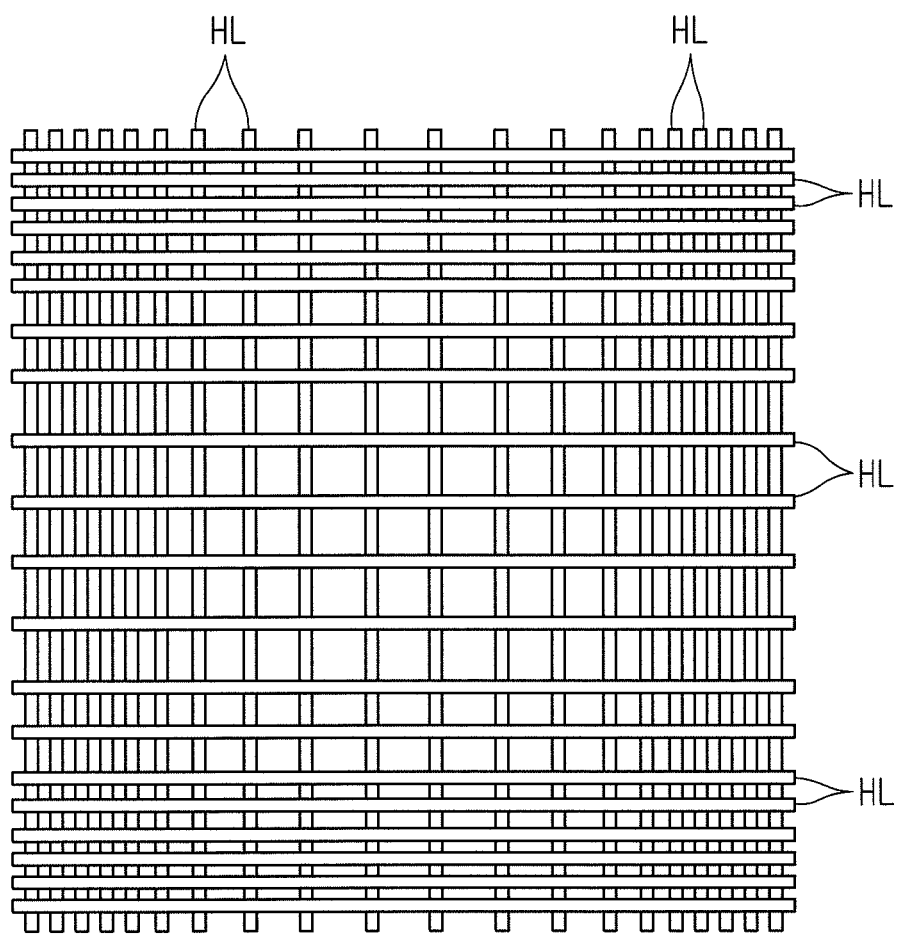
FIG. 7 is a plan view illustrating arrangement of a plurality of halogen lamps.

The halogen heating unit 4 provided below the chamber 6 includes a plurality (in the present preferred embodiment, forty) of the built-in halogen lamps HL. The plurality of halogen lamps HL receive electrical power supplied from an electrical power supply circuit 45 and emit light to irradiate the thermal processing space 65 with halogen light from below the chamber 6 through the lower chamber window 64. The electrical power supply from the electrical power supply circuit 45 is controlled by the control unit 3. FIG. 7 is a plan view illustrating arrangement of the plurality of halogen lamps HL. In the present preferred embodiment, the twenty halogen lamps HL are arranged in each of upper and lower parts. Each halogen lamp HL is a bar lamp having a long cylinder shape. In each of the upper part and the lower part, the twenty halogen lamps HL are arrayed such that the longitudinal directions of the halogen lamps HL are parallel to each other along the main surface of the substrate W held by the holding unit 7 (along the horizontal direction). In the upper and lower parts, the plane of the array of the halogen lamps HL is a horizontal plane.

As illustrated in FIG. 7, in the upper and lower parts, the halogen lamps HL have a higher arrange density in a region opposite to a peripheral part of the substrate W held by the holding unit 7 than in a region opposite to a central part of the substrate W. In other words, in the upper and lower parts, the halogen lamps HL have a shorter arrange pitch in the peripheral part of the lamp array than in the central part thereof. With this configuration, irradiation with a larger light quantity can be performed in the peripheral part of the substrate W, in which temperature fall is likely to occur at heating through irradiation with light from the halogen heating unit 4.

A lamp group of the halogen lamps HL in the upper part and a lamp group of the halogen lamps HL in the lower part are arrayed so as to intersect with each other in a lattice. In other words, a total of forty of the halogen lamps HL are arranged to be such that the longitudinal directions of the halogen lamps HL arranged in the upper part and the longitudinal directions of the halogen lamps HL arranged in the lower part are orthogonal to each other.

Each halogen lamp HL is a filament-type light source that passes current a filament arranged inside the glass tube to make the filament incandescent, there by emitting light. The glass tube encapsulates inert gas such as nitrogen or argon introduced with a small amount of halogen element (iodine or bromine, for example). The introduction of halogen element allows the temperature of the filament to be set to a high temperature while reducing damage on the filament. Thus, the halogen lamp HL has a long life and is capable of continuously emitting light with a high intensity as compared to a normal filament lamp. In other words, the halogen lamp HL is a continuously lighting lamp configured to emit light continuously for at least one second or longer. Since the halogen lamp HL is a bar lamp, the halogen lamp HL has a long life, and the halogen lamp HL achieves an excellent efficiency of emission to the substrate W held above the halogen lamp HL, when arranged in the horizontal direction.

As illustrated in FIG. 1, the thermal processing apparatus 1 includes the shutter mechanism 2 beside the halogen heating unit 4 and the chamber 6. The shutter mechanism 2 includes a shutter plate 21 and a slide drive mechanism 22. The shutter plate 21 is not transparent to halogen light, and made of, for example, titanium (Ti). The slide drive mechanism 22 slides the shutter plate 21 in the horizontal direction to and from a light-shielding position between the halogen heating unit 4 and the holding unit 7. When moved forward by the slide drive mechanism 22, the shutter plate 21 is inserted to the light-shielding position (position illustrated with a dashed and double-dotted line in FIG. 1) between the chamber 6 and the halogen heating unit 4 so as to block the lower chamber window 64 from the plurality of halogen lamps HL. Accordingly, light emitted from the plurality of halogen lamps HL toward the holding unit 7 in the thermal processing space 65 is blocked. In contrast, when moved backward by the slide drive mechanism 22, the shutter plate 21 is removed from the light-shielding position between the chamber 6 and the halogen heating unit 4 to leave a space below the lower chamber window 64 open.

Figure 8:
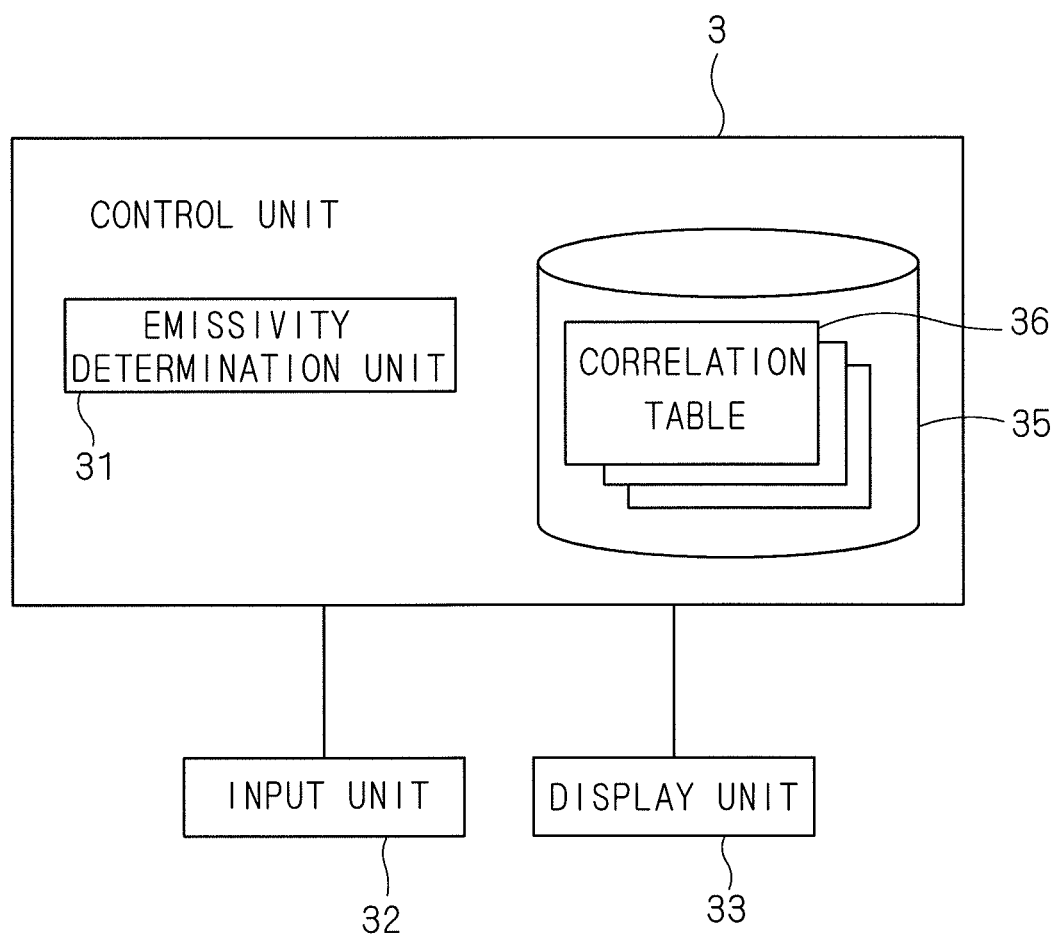
FIG. 8 is a block diagram of the configuration of a control unit.

The control unit 3 controls various kinds of the operation mechanisms provided to the thermal processing apparatus 1. FIG. 8 is a block diagram of the configuration of the control unit 3. The control unit 3 has a hardware configuration same as that of a typical computer. In other words, the control unit 3 includes a CPU that is a circuit configured to perform various kinds of arithmetic processing, a ROM as a read-only memory configured to store therein a basic computer program, a RAM as a writable memory configured to store therein various kinds of information, and a magnetic disk 35 configured to store therein control software and data. Processing in the thermal processing apparatus 1 is proceeded by the CPU of the control unit 3 executing a predetermined processing program.

As illustrated in FIG. 8, the control unit 3 includes an emissivity determination unit 31. The emissivity determination unit 31 is a functional processing unit achieved by the CPU of the control unit 3 executing a predetermined processing program. The content of processing by the emissivity determination unit 31 will be further described later.

The control unit 3 is connected with an input unit 32 and a display unit 33. Examples of the input unit 32 include various kinds of well-known input instruments such as a keyboard and a mouse. The display unit 33 is, for example, a display panel such as a liquid crystal display provided to an outer wall of the thermal processing apparatus 1. The input unit 32 and the display unit 33 may be a touch panel having functions of the both units.

The thermal processing apparatus 1 includes, in addition to the above-described configuration, various cooling structures to prevent excessive rise in the temperature of the halogen heating unit 4, the flash heating unit 5, and the chamber 6 due to thermal energy generated from the halogen lamps HL and the flash lamps FL at the thermal processing of the substrate W. For example, a water-cooling tube (not illustrated) is provided to the wall of the chamber 6. The halogen heating unit 4 and the flash heating unit 5 have air cooling structures in which gas flow is generated to release heat. Air is supplied to a gap between the upper chamber window 63 and the lamp light emission window 53 so as to cool the flash heating unit 5 and the upper chamber window 63.

Figure 9:
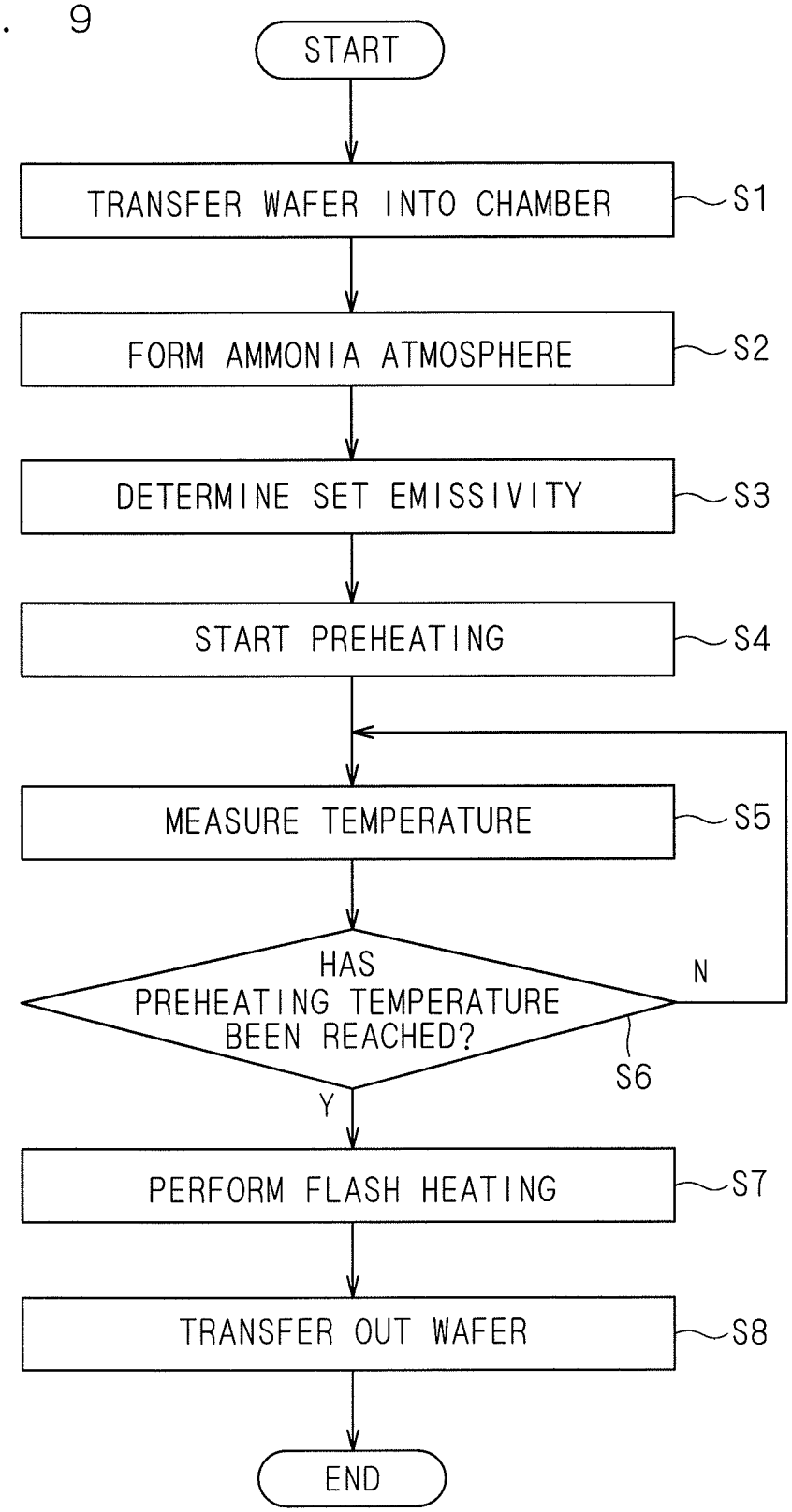
FIG. 9 is a flowchart of a procedure of processing a substrate.

The following describes a procedure of processing the substrate W. FIG. 9 is a flowchart of the procedure of processing the substrate W. The substrate W to be processed is a semiconductor wafer on which a high-dielectric-constant film is formed as a gate insulating film. The thermal processing apparatus 1 irradiates the substrate W with flash light to perform post deposition annealing. The procedure of processing by the thermal processing apparatus 1 described below proceeds as the control unit 3 controls each operation mechanism of the thermal processing apparatus 1.

First, the substrate W to be processed is transferred into the chamber 6 of the thermal processing apparatus 1 (step S1). When the substrate W is transferred into the chamber 6, a gate valve 85 is opened to open the transfer opening 66, and the substrate W is transferred into the thermal processing space 65 in the chamber 6 through the transfer opening 66 by a transfer robot outside of the apparatus. Simultaneously, the valve 183 may be opened to continuously supply nitrogen gas into the chamber 6 to allow nitrogen gas flow to be output through the transfer opening 66, thereby minimizing flow of atmosphere outside of the apparatus into the chamber 6. The substrate W transferred in by the transfer robot is moved to a position directly above the holder 7 and stops there. Then, the pair of transfer arms 11 of the transfer mechanism 10 horizontally move from the retracted position to the transfer operation position and rise, so that the lift pins 12 stick out of the upper surface of the susceptor 74 through the through-hole 79 so as to receive the substrate W.

After the substrate W is placed on the lift pins 12, the transfer robot leaves the thermal processing space 65, the transfer opening 66 is closed by the gate valve 85. Then, the pair of transfer arms 11 are moved down to pass the substrate W from the transfer mechanism 10 to the susceptor 74 of the holding unit 7 so that the substrate W is held in a horizontal posture. The substrate W is held by the susceptor 74 with its front surface being held upward, on which the high-dielectric-constant film is formed. The substrate W is held inside of the five guide pins 76 on the upper surface of the susceptor 74. When moved down to below the susceptor 74, the pair of transfer arms 11 is retracted to the retracted position, in other words, the inside of the recess 62 by the horizontal movement mechanism 13.

After the substrate W is housed in the chamber 6, processing gas is supplied into the chamber 6 to form ammonia atmosphere (step S2). Specifically, gas in the thermal processing space 65 is exhausted when the valve 89 is opened, and mixed gas of ammonia and nitrogen gas as diluent gas is supplied into the thermal processing space 65 through the gas supply hole 81 when the valve 183 and the valve 187 are opened. As a result, ammonia atmosphere is formed around the substrate W held by the holding unit 7 in the chamber 6. The concentration (which is, a mixture ratio of ammonia and nitrogen gas) of ammonia in the ammonia atmosphere is defined by the flow-rate adjustment valve 181 and the flow-rate adjustment valve 186. In the present preferred embodiment, the flow rates of ammonia and nitrogen gas are adjusted by the flow-rate adjustment valve 186 and the flow-rate adjustment valve 181 so that the concentration of ammonia in the ammonia atmosphere is 3.5 vol. % approximately. The concentration of ammonia in the ammonia atmosphere only needs to be 10 vol. % or less.

The emissivity determination unit 31 (FIG. 8) determines the set emissivity of the radiation thermometer 120 (step S3). The set emissivity of the radiation thermometer 120 is the emissivity of a temperature-measured object set to the radiation thermometer 120. The radiation thermometer 120 measures the temperature of the temperature-measured object according to Stefan-Boltzmann law represented by $J=\varepsilon\sigma T^4$ (J is thermal emission, $\varepsilon$ is the emissivity of a temperature-measured object, $\sigma$ is the Stefan-Boltzmann constant, and T is the temperature of the temperature-measured object). In other words, the temperature measurement by the radiation thermometer 120 requires the emissivity of the temperature-measured object (in the present preferred embodiment, the substrate W). Normally, the set emissivity of the radiation thermometer 120 only needs to be set to be the emissivity of the back surface (main surface opposite to the front surface on which the high-dielectric-constant film is formed) of the substrate W.

However, in the present preferred embodiment, the ammonia atmosphere is formed in the thermal processing space 65 in the chamber 6. The absorption wavelength band of ammonia includes 8 μm to 14 μm. The measurement wavelength band of the radiation thermometer 120 is 6.5 μm to 14 μm. In other words, the measurement wavelength band of the radiation thermometer 120 overlaps with the absorption wavelength band of ammonia as the processing gas. This overlapping includes not only complete match of the measurement wavelength band of the radiation thermometer 120 and the absorption wavelength band of the processing gas but also partial overlapping thereof.

When the measurement wavelength band of the radiation thermometer 120 overlaps with the absorption wavelength band of ammonia, radiation light from the substrate W, which is used by the radiation thermometer 120 in the temperature measurement, is absorbed by the ammonia atmosphere, and the intensity of radiation light in the measurement wavelength band received by the radiation thermometer 120 is reduced accordingly. As a result, a temperature value measured by the radiation thermometer 120 is lower than the actual temperature of the substrate W. As described later, at preheating of the substrate W, the control unit 3 performs closed-loop control of the output of the halogen lamps HL based on a result of the temperature measurement by the radiation thermometer 120. Thus, the output of the halogen lamps HL is excessive when the temperature value measured by the radiation thermometer 120 is lower than the actual temperature of the substrate W.

For this reason, in the present preferred embodiment, the set emissivity of the radiation thermometer 120 is changed and set to be lower than the actual emissivity of the substrate W. According to the above-described Stefan-Boltzmann law, when the emissivity c is reduced proportionally to reduction in the intensity J of the radiation light received by the radiation thermometer 120, the radiation thermometer 120 can accurately output the temperature of the substrate W as a measured value. Specifically, the emissivity determination unit 31 determines the set emissivity of the radiation thermometer 120 as described below.

A correlation table 36 (FIG. 8) representing a correlation relation between the concentration of ammonia as the processing gas and the set emissivity is prepared in advance before the thermal processing of the substrate W. FIG. 10 is a diagram illustrating an exemplary correlation table 36 representing the correlation relation between the concentration of ammonia and the set emissivity. As described above, since the measurement wavelength band of the radiation thermometer 120 overlaps with the absorption wavelength band of ammonia, the intensity of radiation light from the substrate W received by the radiation thermometer 120 decreases as the ammonia concentration in the ammonia atmosphere in the chamber 6 increases. Then, according to the above-described Stefan-Boltzmann law, when the temperature of the substrate W is constant, the intensity of radiation light from the substrate W received by the radiation thermometer 120 is proportional to the set emissivity. Thus, as illustrated in FIG. 10, a linear correlation relation exists between the ammonia concentration in the chamber 6 and the set emissivity of the radiation thermometer 120. This indicates that the radiation thermometer 120 can accurately measure the temperature of the substrate W when the set emissivity is reduced as the ammonia concentration increases.

However, the gradient of the correlation relation between the concentration of ammonia and the set emissivity varies between different temperatures of the substrate W. For this reason, the correlation table 36 as illustrated in FIG. 10 is preferably prepared individually for each of a plurality of temperatures of the substrate W. For example, the temperature measurement by the radiation thermometer 120 plays an important role at preheating by the halogen lamps HL to be described later, and thus the correlation table 36 representing the correlation relation between the concentration of ammonia and the set emissivity is preferably prepared individually for each of a plurality of temperatures assumed as a preheating temperature T1 that is a target temperature of the preheating.

In a specific method of producing the correlation table 36, for example, a thermocouple is attached to a dummy substrate made of a material same as that of the substrate W to be processed, and the dummy substrate is transferred into the chamber 6 of the thermal processing apparatus 1 and placed on the susceptor 74 of the holding unit 7. Then, ammonia atmosphere at a predetermined ammonia concentration is formed in the chamber 6, and the dummy substrate is heated through light irradiation by the halogen lamps HL. The temperature of the dummy substrate is accurately measured by the thermocouple, and the temperature of the dummy substrate is accurately risen to a candidate preheating temperature and maintained at this temperature through the light irradiation by the halogen lamps HL. The set emissivity at the predetermined ammonia concentration is such an emissivity that the accurate temperature of the dummy substrate measured by the thermocouple matches with a temperature indicated by the radiation thermometer 120, which is calculated according to Stefan-Boltzmann law, through reception of radiation light from the dummy substrate. The set emissivity is calculated by changing the ammonia concentration in the chamber 6 while maintaining the temperature of the dummy substrate, thereby producing the correlation table 36 at a certain temperature. In the same manner, the correlation table 36 is produced for each of a plurality of candidate preheating temperatures. The plurality of produced correlation tables 36 are stored in the magnetic disk 35 of the control unit 3 (refer to FIG. 8).

When the emissivity determination unit 31 determines the set emissivity of the radiation thermometer 120 in step S3 in FIG. 9, the value of the preheating temperature T1 is acquired from, for example, a processing recipe (description of the procedure and condition of processing the substrate W to be processed). The emissivity determination unit 31 selects the correlation table 36 produced for the preheating temperature T1 from among the plurality of correlation tables 36 stored in the magnetic disk 35, and determines the set emissivity corresponding to the ammonia concentration in atmosphere in the chamber 6 based on this correlation table 36. For example, in the present preferred embodiment, the emissivity determination unit 31 selects the correlation table 36 for a temperature of 450° C., and determines the set emissivity corresponding to an ammonia concentration of 3.5 vol. % based on this correlation table 36. Alternatively, the preheating temperature T1 and the ammonia concentration in the chamber 6 may be input by an operator through the input unit 32. The set emissivity determined by the emissivity determination unit 31 may be displayed on the display unit 33.

Next, the forty halogen lamps HL of the halogen heating unit 4 are all turned on to start preheating (assist heating) of the substrate W (step S4). Halogen light emitted from the halogen lamps HL transmits through the lower chamber window 64 and the susceptor 74 made of quartz and is incident on the back surface of the substrate W. The temperature of the substrate W is risen through reception of the light irradiation by the halogen lamps HL. The transfer arms 11 of the transfer mechanism 10, which are retracted inside of the recess 62, does not disturb the heating by the halogen lamps HL.

At the preheating by the halogen lamps HL, the temperature of the substrate W is measured by the radiation thermometer 120 (step S5). The set emissivity determined by the emissivity determination unit 31 in step S3 is set to the radiation thermometer 120. The radiation thermometer 120 receives radiation light emitted from the back surface of the substrate W through the opening 78 of the susceptor 74, and measures the temperature of the substrate W based on the intensity of the radiation light. Since the measurement wavelength band of the radiation thermometer 120 overlaps with the absorption wavelength band of ammonia, radiation light from the substrate W used by the radiation thermometer 120 in the temperature measurement is absorbed by the ammonia atmosphere. However, the set emissivity lower than the actual emissivity of the substrate W is set to the radiation thermometer 120, and thus the radiation thermometer 120 can accurately measure the temperature of the substrate W.

The temperature of the substrate W measured by the radiation thermometer 120 is transmitted to the control unit 3. The control unit 3 controls output of the halogen lamps HL while monitoring whether the temperature of the substrate W, which is risen through the light irradiation from the halogen lamps HL, reaches a predetermined preheating temperature T1. In other words, the control unit 3 controls the output of the halogen lamps HL by performing closed-loop control of the electrical power supply circuit 45 based on a result of the measurement by the radiation thermometer 120 so that the temperature of the substrate W reaches the preheating temperature T1 (steps S5 and S6). Since the radiation thermometer 120 accurately measures the temperature of the substrate W even in the ammonia atmosphere, which absorbs infrared light, the control unit 3 can appropriately control the output of the halogen lamps HL. The preheating temperature T1 ranges between 300° C. and 600° C. inclusive, and is 450° C. in the present preferred embodiment.

After the temperature of the substrate W has reached the preheating temperature T1, the control unit 3 temporarily maintains the substrate W at the preheating temperature T1. Specifically, when the temperature of the substrate W measured by the radiation thermometer 120 reaches the preheating temperature T1, the control unit 3 controls the electrical power supply circuit 45 to adjust the intensity of the halogen lamps HL, thereby maintaining the temperature of the substrate W substantially at the preheating temperature T1.

Such preheating by the halogen lamps HL achieves uniform temperature rise of the entire substrate W including the high-dielectric-constant film to the preheating temperature T1. At the preheating by the halogen lamps HL, the temperature of the peripheral part of the substrate W, from which heat is more likely to be released, tends to fall below the temperature of the central part of the substrate W. However, the arrange density of the halogen lamps HL in the halogen heating unit 4 is higher in the region opposite to the peripheral part of the substrate W than in the region opposite to the central part of the substrate W. With this configuration, a larger amount of light is incident on the peripheral part of the substrate W, from which heat is likely to be released, thereby achieving a uniform in-plane temperature distribution of the substrate W at the preheating. In addition, since the inner peripheral surface of the reflection ring 69 mounted on the chamber side part 61 is mirrored, a larger amount of light is reflected toward the peripheral part of the substrate W by the inner peripheral surface of the reflection ring 69, thereby further achieving a uniform in-plane temperature distribution of the substrate W at the preheating.

Next, when a predetermined time has elapsed since the temperature of the substrate W reached the preheating temperature T1, flash heating processing through irradiation with flash light from the flash lamps FL is executed (step S7). Part of the flash light emitted from the flash lamps FL propagates directly to the chamber 6, and the other part is reflected by the reflector 52 and then propagates to the chamber 6, whereby the flash heating of the substrate W is performed through irradiation with these parts of the flash light.

The flash heating is performed through flash light (spark of light) irradiation by the flash lamps FL, which can rise the front surface temperature of the substrate W in a short time. Specifically, the flash light emitted from the flash lamps FL is an extremely short and strong spark of light achieved by conversion of electrostatic energy previously stored in the capacitor into an extremely short light pulse and having an irradiation time approximately ranging from 0.1 millisecond to 100 milliseconds inclusive. Then, the front surface temperature of the substrate W subjected to flash heating through the flash light irradiation by the flash lamps FL instantaneously rises to a processing temperature T2 to execute post deposition annealing of the high-dielectric-constant film formed on the surface of the substrate W. The processing temperature T2, which is a highest temperature (peak temperature) at which the front surface of the substrate W reaches through the flash light irradiation, ranges between 600° C. and 1,200° C. inclusive, and is 1,000° C. in the present preferred embodiment.

When the flash light irradiation by the flash lamps FL ends, the front surface temperature of the substrate W rapidly falls from the processing temperature T2. After a predetermined time has elapsed since the flash light irradiation ended, the halogen lamps HL are turned off, and the substrate W falls from the preheating temperature T1 accordingly. After the heating processing of the substrate W ends, only the valve 187 is closed to replace the inside of the chamber 6 with nitrogen gas atmosphere. Simultaneously with the turning off of the halogen lamps HL, the shutter mechanism 2 inserts the shutter plate 21 to the light-shielding position between the halogen heating unit 4 and the chamber 6. The temperatures of filaments and tube walls do not fall shortly after the halogen lamps HL are turned off, but radiation heat is still emitted from the filaments and the tube walls temporarily at high temperature, which prevents fall of the temperature of the substrate W. When the shutter plate 21 is inserted, however, radiation heat emitted to the thermal processing space 65 from the halogen lamps HL right after turned off is blocked, thereby increasing the speed of fall of the temperature of the substrate W.

The temperature of the substrate W during the fall is measured by the radiation thermometer 120. The measured temperature of the substrate W is transmitted to the control unit 3. The control unit 3 monitors whether the temperature of the substrate W measured by the radiation thermometer 120 has fallen to a predetermined temperature. Then, after the temperature of the substrate W falls below the predetermined temperature, the pair of transfer arms 11 of the transfer mechanism 10 are horizontally moved from the retracted position to the transfer operation position and risen again, so that the lift pins 12 stick out of the upper surface of the susceptor 74 to receive, from the susceptor 74, the substrate W after the thermal processing. Subsequently, the transfer opening 66, which has been closed by the gate valve 85, is opened, and the substrate W placed on the lift pins 12 is transferred out by the transfer robot outside of the apparatus (step S8), which completes the heating processing of the substrate W in the thermal processing apparatus 1.

In the present preferred embodiment, since the ammonia atmosphere that absorbs infrared light is formed in the chamber 6, the set emissivity of the radiation thermometer 120 is changed and set to be lower than the actual emissivity of the substrate W. Specifically, the correlation table 36 representing the correlation relation between the concentration of ammonia and the set emissivity is prepared for each of a plurality of temperatures, and the emissivity determination unit 31 selects the correlation table 36 corresponding to the preheating temperature T1 and determines the set emissivity corresponding to the ammonia concentration in the ammonia atmosphere in the chamber 6 based on this correlation table 36. This allows the radiation thermometer 120 to accurately measure the temperature of the substrate W in the ammonia atmosphere that absorbs infrared light, thereby achieving appropriate control of the output of the halogen lamps HL at preheating based on a result of measurement by the radiation thermometer 120.

The above describes the preferred embodiments of the present invention, but various kinds of modifications of the present invention other than those described above can be performed without departing from the scope of the present invention. For example, the ammonia atmosphere is formed in the chamber 6 in the preferred embodiment, but the present invention is not limited thereto. The technology according to the present invention can be applied to a case in which atmosphere of processing gas having an absorption wavelength band that overlaps with the measurement wavelength band of the radiation thermometer 120 is formed in the chamber 6. Examples of processing gas having an absorption wavelength band that overlaps with the measurement wavelength band (6.5 μm to 14 μm) of the radiation thermometer 120 include nitrous oxide ($N_2O$) and nitrogen monoxide (NO) in addition to ammonia. When atmosphere of these processing gasses is formed in the chamber 6, similarly to the above-described preferred embodiment, the set emissivity of the radiation thermometer 120 is changed and set to be lower than the actual emissivity of the substrate W, which allows accurate measurement of the temperature of the substrate W.

In the above-described preferred embodiment, the set emissivity is determined by using the correlation table 36 representing the correlation relation between the concentration of ammonia and the set emissivity. Instead, the emissivity determination unit 31 may determine the set emissivity of the radiation thermometer 120 based on a relational expression representing the correlation relation between the concentration of ammonia and the set emissivity.

Although the thirty flash lamps FL are provided to the flash heating unit 5 in the above-described preferred embodiment, the present invention is not limited thereto, and an optional number of the flash lamps FL may be provided. Each flash lamp FL is not limited to a xenon flash lamp, but may be a krypton flash lamp. The number of the halogen lamps HL included in the halogen heating unit 4 is not limited to forty but may be optional.

In the above-described preferred embodiment, the technology according to the present invention is applied to temperature measurement at preheating by the thermal processing apparatus 1 that irradiates the substrate W with flash light from the flash lamps FL after preheating by the halogen lamps HL. However, the technology according to the present invention may be applied to an apparatus (for example, a spike annealing apparatus) that heats the substrate W only with halogen lamps.

While the invention has been shown and described in detail, the foregoing description is in all aspects illustrative and not restrictive. It is therefore understood that numerous modifications and variations can be devised without departing from the scope of the invention.

What is claimed is:

1. A thermal processing method of heating a substrate by irradiating the substrate with light, the method comprising the steps of:
    (a) supplying predetermined processing gas to a chamber housing a substrate to form atmosphere of the processing gas around said substrate;
    (b) irradiating said substrate in said atmosphere of the processing gas with light from a light irradiation unit;
    (c) measuring the temperature of said substrate through a radiation thermometer receiving infrared light emitted from said substrate; and
    (d) controlling output of said light irradiation unit based on a result of the measurement in said step (c) so that said substrate reaches a target temperature,
wherein a set emissivity of said radiation thermometer is changed to be lower than the actual emissivity of said substrate when a measurement wavelength band of said radiation thermometer overlaps with an absorption wavelength band of said processing gas.

2. The thermal processing method according to claim 1, wherein said set emissivity is determined from the concentration of said processing gas in atmosphere in said chamber based on a table representing a correlation relation between a concentration of said processing gas and said set emissivity.

3. The thermal processing method according to claim 2, wherein said table is produced individually for each of a plurality of target temperatures.

4. The thermal processing method according to claim 1, wherein said processing gas is ammonia.

5. The thermal processing method according to claim 1, wherein said light irradiation unit includes a halogen lamp.

* * * * *